US012633813B2

(12) United States Patent　　　(10) Patent No.: US 12,633,813 B2

Harrison　　　(45) Date of Patent: May 19, 2026

(54) ENERGY MANAGEMENT SYSTEM

(71) Applicant: Enphase Energy, Inc., Petaluma, CA (US)

(72) Inventor: Michael J. Harrison, Petaluma, CA (US)

(73) Assignee: Enphase Energy, Inc., Petaluma, CA (US)

( * ) Notice: Subject to any disclaimer, the term of this patent is extended or adjusted under 35 U.S.C. 154(b) by 159 days.

(21) Appl. No.: 18/413,743

(22) Filed: Jan. 16, 2024

(65) Prior Publication Data

US 2024/0283347 A1　　Aug. 22, 2024

Related U.S. Application Data

(60) Provisional application No. 63/446,539, filed on Feb. 17, 2023.

(51) Int. Cl.
| | |
|---|---|
| *G01R 15/18* | (2006.01) |
| *G01R 19/25* | (2006.01) |
| *H01F 27/42* | (2006.01) |
| *H02M 1/00* | (2007.01) |

(52) U.S. Cl.
CPC .......... *H02M 1/0009* (2021.05); *G01R 15/18* (2013.01); *H01F 27/427* (2013.01); *G01R 19/25* (2013.01)

(58) Field of Classification Search
None
See application file for complete search history.

(56) References Cited

U.S. PATENT DOCUMENTS

| | | | | |
|---|---|---|---|---|
| 10,802,054 | B2* | 10/2020 | Schweitzer, III | ...... G01R 31/11 |
| 12,095,361 | B2* | 9/2024 | Harrison | ............. H02M 1/0085 |
| 2014/0376278 | A1* | 12/2014 | Fornage | .................. H02M 1/12 |
| | | | | 363/21.12 |
| 2015/0098251 | A1* | 4/2015 | Harrison | ................... H02J 3/46 |
| | | | | 363/56.05 |
| 2016/0091554 | A1* | 3/2016 | Fornage | ................. G01R 27/18 |
| | | | | 324/509 |
| 2022/0416678 | A1* | 12/2022 | Harrison | ............. H02M 7/5387 |
| 2023/0015609 | A1* | 1/2023 | Harrison | ................ H02M 1/44 |
| 2024/0348150 | A1* | 10/2024 | Harrison | ............... H02M 1/088 |

* cited by examiner

*Primary Examiner* — Jermele M Hollington

(74) *Attorney, Agent, or Firm* — Moser Taboada

(57) ABSTRACT

An apparatus configured for use with a microinverter of an energy management system is provided. For example, apparatus can comprise a cascaded current transformer configuration comprising a first current transformer having a first primary winding configured to couple to a secondary winding of a power transformer of the microinverter and having a first secondary winding coupled to a second primary winding of a second current transformer having a second secondary winding coupled to a measurement device configured to measure a current of the microinverter.

13 Claims, 4 Drawing Sheets

108

ITank
Current

300

301

$(P_{cr}=1)$

Current
Transformer $S_{cr}$

302

$R_A$

+     −

ADC          chip     303

402                                          404

400$_a$          402$_b$   403$_b$     402$_c$   403$_c$     404$_d$   403$_d$     404$_e$   403$_e$     404$_f$   403$_f$

CT$_a$          CT$_b$      401$_c$      CT$_c$              CT$_d$     401$_e$      CT$_e$     401$_f$      CT$_f$ 301                301                                301

A                                      A                                        A

1:4096          1:64         1:64              1:16        1:16            1:16

ENERGY MANAGEMENT SYSTEM

CROSS-REFERENCE TO RELATED APPLICATIONS

The present application claims the benefit of and priority to U.S. Provisional Application Ser. No. 63/446,539, filed on Feb. 17, 2023, the entire contents of which is incorporated herein by reference.

BACKGROUND

1. Field of the Disclosure

Embodiments of the present disclosure generally relate to power systems and, for example, to energy management systems that comprise microinverters with cascaded current transformers configured to increase frequency bandwidth performance.

2. Description of the Related Art

Conventional energy management systems, typically, comprise one or more power sources connected to one or more power converters that can be connected to one or more energy storage devices/delivery devices. One or more controllers can be connected to the one or more power sources, the one or more power converters, and/or the one or more energy storage devices/delivery devices for control thereof during operation. For example, the one or more controllers can be configured to control switching of one or more switches of the one or more power converters (e.g., microinverter). For example, the one or more switches can be Gallium Nitride (GaN) power semiconductor switches, which can increase a switching frequency of the microinverter, which, in turn, enables the microinverter to be made relatively small and at a lower cost.

With traditional current transformers of the microinverter, however, there is a design trade-off between a turns ratio and a frequency bandwidth that the transformer can achieve. For example, if there is a need for a high turns ratio current transformer, the current transformer may suffer from a lower frequency bandwidth when compared to a current transformer with a low turns ratio.

Therefore, the inventor has provided herein improved energy management systems that comprise microinverters with cascaded current transformer configured to increase frequency bandwidth performance.

SUMMARY

In accordance with some aspects of the present disclosure, an apparatus configured for use with a microinverter of an energy management system comprises a cascaded current transformer configuration comprising a first current transformer having a first primary winding configured to couple to a secondary winding of a power transformer of the microinverter and having a first secondary winding coupled to a second primary winding of a second current transformer having a second secondary winding coupled to a measurement device configured to measure a current of the microinverter.

In accordance with some aspects of the present disclosure, an energy management system comprises a DC power source connected to a power converter to convert DC power from the DC power source to grid-compliant AC power that is coupled to an AC bus. A cascaded current transformer configuration comprises a first current transformer having a first primary winding configured to couple to a secondary winding of a power transformer of the power converter and has a first secondary winding coupled to a second primary winding of a second current transformer having a second secondary winding coupled to a measurement device configured to measure a current of the power converter.

These and other features and advantages of the present disclosure may be appreciated from a review of the following detailed description of the present disclosure, along with the accompanying figures in which like reference numerals refer to like parts throughout.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only a typical embodiment of this disclosure and are therefore not to be considered limiting of its scope, for the disclosure may admit to other equally effective embodiments.

DETAILED DESCRIPTION

Energy management systems are provided herein. For example, apparatus described herein are configured for use with a microinverter of an energy management system. The apparatus can comprise a cascaded current transformer configuration comprising a first current transformer having a first primary winding. The first primary winding is configured to couple to a secondary winding of a power transformer of the microinverter and a first secondary winding is coupled to a second primary winding of a second current transformer. The second current transformer has a second secondary winding coupled to a measurement device configured to measure current of the microinverter. The microinverters described herein are configured to increase frequency bandwidth performance. For example, a cascaded current transformer can achieve a high effective turns ratio while at the same time keeping an actual number of secondary turns to a relatively low value, thus resulting in a high frequency bandwidth solution.

Figure 1:
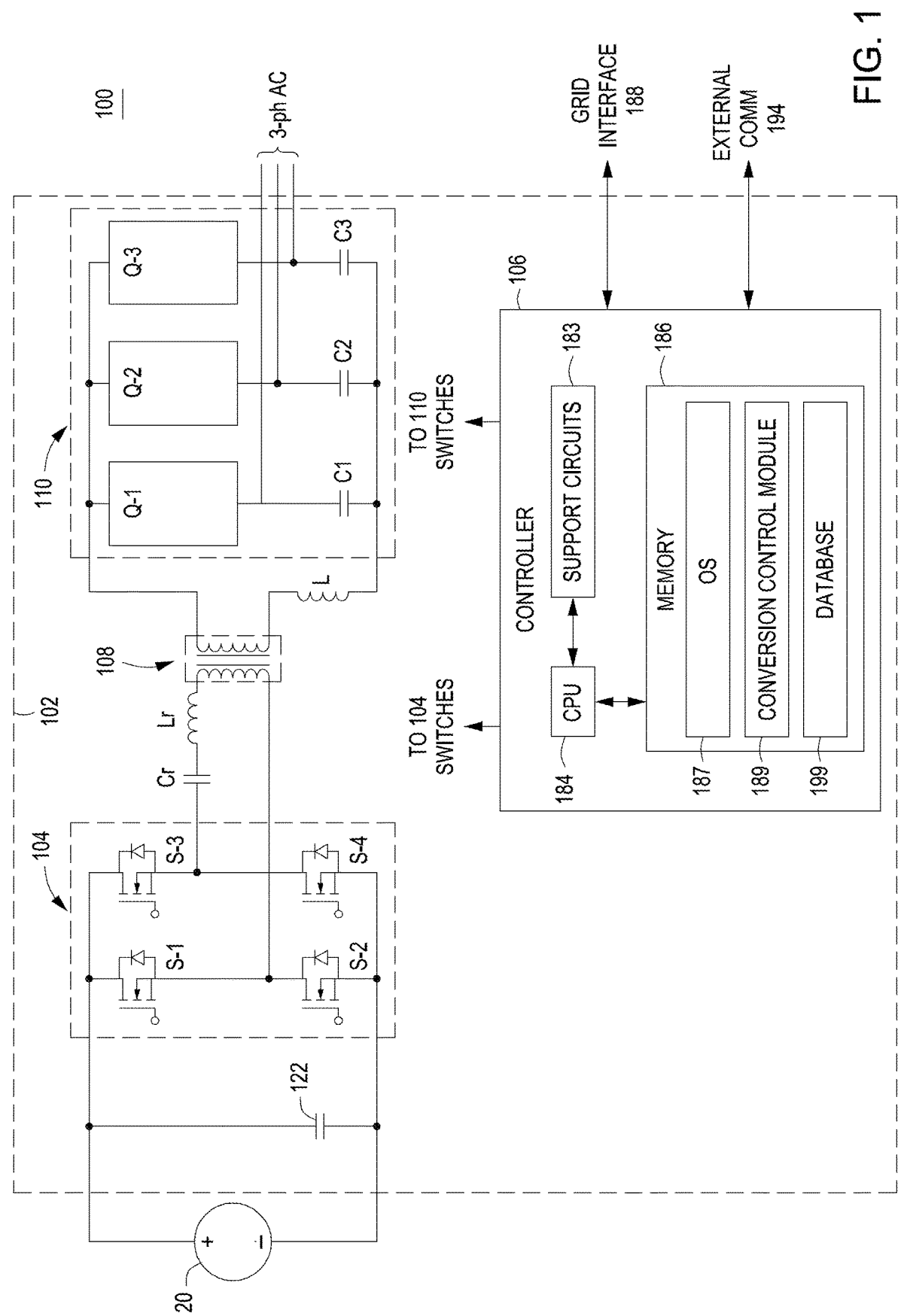
FIG. 1 is a schematic diagram of a power conversion system comprising a switched mode power, in accordance with at least some embodiments of the present disclosure.

FIG. 1 is a schematic diagram of a power conversion system 100 comprising a power converter 102 (e.g., switched mode power converter), in accordance with at least some embodiments of the present disclosure. This diagram only portrays one variation of the myriad of possible system configurations. The present disclosure can function in a variety of power generation environments and systems.

The power conversion system 100 comprises a DC component 120, such as a PV module or a battery, coupled to a DC side of the power converter 102. In other embodiments the DC component 120 may be any suitable type of DC components, such as another type of renewable energy source (e.g., wind farms, hydroelectric systems, and the like), other types of energy storage components, and the like.

The power converter 102 comprises a capacitor 122 coupled across the DC component 120 as well as across an H-bridge 104 formed from switches S-1, S-2, S-3 and S-4. The switches S-1 and S-2 are coupled in series to form a left leg of the H-bridge 104, and the switches S-3 and S-4 are coupled in series to form a right leg of the H-bridge 104.

The output of the H-bridge 104 is coupled across a series combination of a capacitor Cr and inductor L, which form a resonant tank, and the primary winding of a transformer 108 (e.g., a power transformer for transferring power from the primary winding to the secondary winding). In other embodiments, the resonant tank may be formed by a different configuration of the capacitor Cr and the inductor Lr (e.g., the capacitor Cr and the inductor L may be coupled in parallel); in some embodiments, Lr may represent a leakage inductance from the transformer 108 rather than a physical inductor.

A series combination of the secondary winding of the transformer 108 and an inductor L is coupled across a cycloconverter 110 which produces a three-phase AC output, although in other embodiments the cycloconverter 110 may produce one or two phases of AC at its output. The cycloconverter 110 comprises three 4Q bi-directional switches Q-1, Q-2, and Q-3 (at least three switches, which may be collectively referred to as switches Q) respectively in a first leg, a second leg, and a third leg coupled in parallel to one another. In accordance with embodiments of the present disclosure, each of the switches Q-1, Q-2, and Q-3 is a native four quadrant bi-directional switch. The switches Q-1, Q-2, and Q-3 can any suitable type of switch. For example, the switches Q-1, Q-2, and Q-3 can be similar to the switches S-1, S-2, S-3 and S-4. In at least some embodiments, the switches Q-1, Q-2, and Q-3 are Gallium Nitride (GaN) power semiconductor switches.

The first cycloconverter leg comprises the 4Q switch Q-1 coupled to a capacitor C1, the second cycloconverter leg comprises the 4Q switch Q-2 coupled to a capacitor C2, and the third cycloconverter leg comprises a 4Q switch Q-3 coupled to a capacitor C3. A first AC output phase line is coupled between the switch Q-1 and the capacitor C1, a second AC output phase line is coupled between the switch Q-2 and the capacitor C2, and a third AC output phase line is coupled between the switch Q-3 and the capacitor C3. The power converter 102 may also include additional circuitry not shown, such as voltage and/or current monitors, for obtaining data for power conversion, data reporting, and the like.

The power converter 102 additionally comprises a controller 106 coupled to the H-bridge switches (S-1, S-2, S-3, and S-4) and the cycloconverter switches (Q-1, Q-2, and Q-3) for operatively controlling the switches to generate the desired output power. In some embodiments, the power converter 102 may function as a bi-directional converter.

The controller 106 comprises a CPU 184 coupled to each of support circuits 183 and a memory 186. The CPU 184 may comprise one or more conventionally available microprocessors or microcontrollers. Additionally or alternatively, the CPU 184 may include one or more application specific integrated circuits (ASICs). The support circuits 183 are well known circuits used to promote functionality of the CPU 184. Such circuits include, but are not limited to, a cache, power supplies, clock circuits, buses, input/output (I/O) circuits, ADC chips, and the like. The controller 106 may be implemented using a general purpose computer that, when executing particular software, becomes a specific purpose computer for performing various embodiments of the present disclosure.

The memory 186 is a non-transitory computer readable medium such as random access memory, read only memory, removable disk memory, flash memory, and various combinations of these types of memory. The memory 186 is sometimes referred to as main memory and may, in part, be used as cache memory or buffer memory. The memory 186 generally stores the OS 187 (operating system), if necessary, of the controller 106 that can be supported by the CPU capabilities. In some embodiments, the OS 187 may be one of a number of commercially available operating systems such as, but not limited to, LINUX, Real-Time Operating System (RTOS), and the like.

The memory 186 may store various forms of application software, such as a conversion control module 189 for controlling power conversion by the power converter 102, for example maximum power point tracking (MPPT), switching, and the like. The memory 186 may further store a database 199 for storing various data. The controller 106 further processes inputs and outputs to external communications 194 (i.e., gateway) and a grid interface 188.

Figure 2:
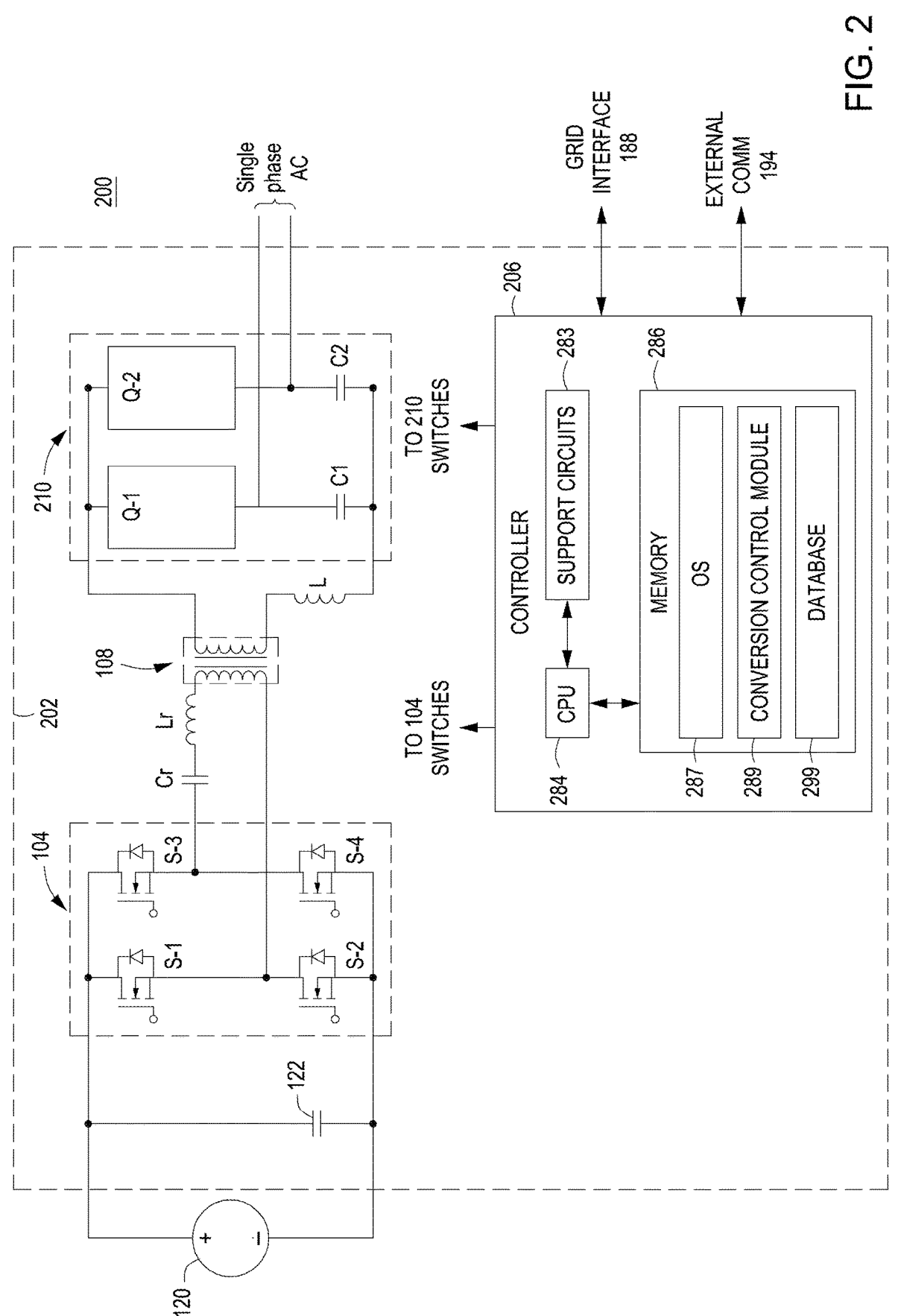
FIG. 2 is a schematic diagram of a power conversion system comprising a switched mode power converter, in accordance with at least some embodiments of the present disclosure.

FIG. 2 is a schematic diagram of a power conversion system 200 comprising a power converter 202 (e.g., a switched mode power converter), in accordance with at least some embodiments of the present disclosure.

The power conversion system 200 comprises the DC component 120 coupled to a DC side of the power converter 202. The power converter 202 comprises the capacitor 122 coupled across the DC component 120 and the H-bridge 104, as described above with respect to the power converter 102. The output of the H-bridge 104 is coupled across a series combination of the capacitor Cr and the inductor Lr, which form a resonant tank, and the primary winding of the transformer 108, as described above with respect to the power converter 102. In other embodiments, the resonant tank may be formed by a different configuration of the capacitor Cr and the inductor Lr (e.g., the capacitor Cr and the inductor L may be coupled in parallel); in some embodiments, Lr may represent a leakage inductance of the transformer 108 rather than a physical inductor.

A series combination of the secondary winding of the transformer 108 and the inductor L is coupled across a cycloconverter 210 which produces a single-phase AC output. The cycloconverter 210 comprises two bi-directional switches Q-1 and Q-2, (at least two switches, collectively referred to as switches Q) respectively in a first leg and a second leg coupled in parallel to one another. In accordance with embodiments of the present disclosure, each of the switches Q-1 and Q-2 is a native four quadrant bi-directional switch.

The first cycloconverter leg comprises the 4Q switch Q-1 coupled to the capacitor C1, and the second cycloconverter leg comprises the 4Q switch Q-2 coupled to the capacitor C2. A first AC output phase line is coupled between the switch Q-1 and the capacitor C1, and a second AC output phase line is coupled between the switch Q-2 and the capacitor C2. The power converter 202 may also include additional circuitry not shown, such as voltage and/or current monitors, for obtaining data for power conversion, data reporting, and the like.

The power converter 202 additionally comprises a controller 206 coupled to the H-bridge switches (S-1, S-2, S-3, and S-4), and the cycloconverter switches (Q-1 and Q-2) for operatively controlling the switches to generate the desired output power. In some embodiments, the power converter 202 may function as a bi-directional converter.

The controller 206 comprises a CPU 284 coupled to each of support circuits 283 and a memory 286. The CPU 284 may comprise one or more conventionally available microprocessors or microcontrollers. Additionally or alternatively, the CPU 284 may include one or more application specific integrated circuits (ASICs). The support circuits 283 are well known circuits used to promote functionality of the CPU 284. Such circuits include, but are not limited to, a cache, power supplies, clock circuits, buses, input/output (I/O) circuits, and the like. The controller 206 may be implemented using a general purpose computer that, when executing particular software, becomes a specific purpose computer for performing various embodiments of the present disclosure.

The memory 286 is a non-transitory computer readable medium such as random access memory, read only memory, removable disk memory, flash memory, and various combinations of these types of memory. The memory 286 is sometimes referred to as main memory and may, in part, be used as cache memory or buffer memory. The memory 286 generally stores the OS 287 (operating system), if necessary, of the controller 206 that can be supported by the CPU capabilities. In some embodiments, the OS 287 may be one of a number of commercially available operating systems such as, but not limited to, LINUX, Real-Time Operating System (RTOS), and the like.

The memory 286 may store various forms of application software, such as a conversion control module 289 for controlling power conversion by the power converter 202, for example maximum power point tracking (MPPT), switching, and the like. The memory 286 may further store a database 299 for storing various data. The controller 206 further processes inputs and outputs to external communications 194 (i.e., gateway) and the grid interface 188.

Figures 3, 4:
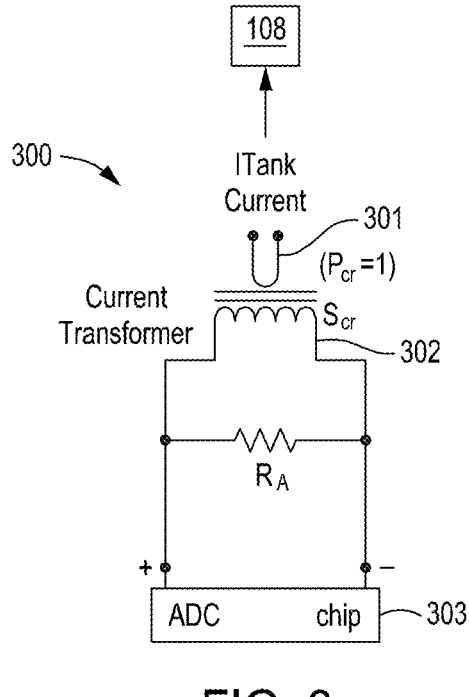
FIG. 3 is a schematic diagram of a current transformer and bias resistors, in accordance with at least some embodiments of the present disclosure.
FIG. 4 is a schematic of a cascaded current transformer, in accordance with at least some embodiments of the present disclosure.

FIG. 3 is a schematic diagram of a current transformer 300 (e.g., an external current transformer) and bias resistors, in accordance with at least some embodiments of the present disclosure. FIG. 3 shows the detail of the current transformer 300 and the associated bias resistors that are used to connect the current transformer to an analog input of an ADC chip 303. The current transformer 300 works similarly to the transformer 108, but instead of being configured as a power transformer, the current transformer 300 is configured to monitor a current (e.g., through the secondary windings of the transformer 108) of a power converter (e.g., a microinverter). Thus, a power rating of the current transformer 300 is, typically, much less than a power rating of the transformer 108 and in some circumstances less than 0.1% of the power rating of a power converter that the current transformer 300 is being used to monitor. Additionally, a configuration of the current transformer 300 is, typically, optimized for ensuring a fidelity of a current being monitored is preserved, i.e., to accurately measure the current being monitored.

Continuing with reference to FIG. 3, a primary winding 301 of the current transformer 300 can be a single turn winding (Pcr) that carries the resonant tank current (iTank) to one or more measurement devices (e.g., the ADC chip

303). For example, the primary winding 301 of the current transformer 300 couples to (e.g., passes through) at least one of the secondary windings 302 of the transformer 108 so that as current flows through the secondary windings 302 of the transformer that current can be fed through (e.g., connected to an analog input of the ADC chip 303) and measured by the ADC chip 303. In at least some embodiments, two bias resistors RA can be provided and configured to allow the ADC chip to be correctly biased to operate over the bias resistors RA specified linear operating voltage. Thus, the output from the current transformer 300 can be correctly scaled to match the same scaling as the ADC.

As noted above, the inventor has found that microinverters with cascaded current transformers (e.g., the current transformer 300) are configured to increase frequency bandwidth performance. For example, a cascaded current transformer can achieve a high effective turns ratio while at the same time keeping an actual number of secondary turns to a relatively low value, thus resulting in a high frequency bandwidth solution.

For example, FIG. 4 is a schematic of a cascaded current transformer, in accordance with at least some embodiments of the present disclosure. For example, the cascaded current transformer concept is described herein by comparing three different current transformer configurations that achieve the same effective turns ratio (e.g., all three current transformer configurations achieve an effective turns ratio of about 1:4096).

For example, a current transformer 400 a (e.g., non-cascaded current transformer) can have a 1:4096 turns ratio. Such a configuration achieves a turns ratio based on the secondary winding having 4096 turns around the transformer core. Similarly, in at least some embodiments, a cascaded current transformer configuration 402 can comprise two current transformers cascaded together. In such an embodiment, each current transformer 402b (a first current transformer comprising a first primary winding (e.g., 301) and a first secondary winding 403b) and current transformer 402c (a second current transformer comprising a second primary winding 401c and a second secondary winding 403c) has a turns ratio of 1:64 (e.g., 64 secondary turns), but since the current transformer 402b and current transformer 402c are connected in a cascaded fashion, a total effective turns ratio is 1:4096 (e.g., by virtue of the two cascaded turns ratios being multiplied together (64×64=4096). Likewise, in at least some embodiments, a cascaded current transformer configuration 404 can comprise three current transformers cascaded together. In such an embodiment, each current transformer 404d (a first current transformer comprising a first primary winding (e.g., 301) and a first secondary winding 403d), current transformer 404e (a second current transformer comprising a second primary winding 401e and a second secondary winding 403e), and transformer 404f (a third current transformer comprising a third primary winding 401f and a third secondary winding 403f) has a turns ratio of 1:16 (e.g., 16 secondary turns), but since current transformer 404d, current transformer 404e, and transformer 404f are connected in a cascaded fashion, a total effective turns ratio is 1:4096 (e.g., by virtue of the three cascaded turns ratios being multiplied together (16×16×16=4096).

The inventor has found that a high frequency bandwidth of each of the current transformer configurations is inversely proportional to a square root of an inter-winding capacitance, which, in turn, is approximately equal to a number of secondary turns (e.g., assuming that all three current transformer configurations use the same transformer core size and wire size). Based on the foregoing, the cascaded current transformer configuration 402 will have a high frequency bandwidth that is about eight (8) times greater than a high frequency bandwidth of the current transformer 400_{a}. Likewise, the cascaded current transformer configuration 404 will have a high frequency bandwidth that is about 16 times greater than the high frequency bandwidth of the current transformer 400_{a}.

For illustrative purposes, the turns ratios were selected so that the three current transformer configurations would achieve the same effective turns ratio while using a common turns ratio for the cascaded current transformer configurations. In at least some embodiments, however, any combination of turns ratios can be selected, and a total effective turns ratio can be a product of the individual cascaded current transformer turns ratios, thus allowing various configuration options based on achieving a target effective turns ratio. From a high frequency bandwidth perspective, however, a main goal can be to keep a number of secondary turns to a minimum.

For example, if an effective turns ratio of 1:1000 is chosen (e.g., if the current transformer configurations are restricted to only cascading two individual current transformers), in at least some embodiments the current transformer configuration can comprise a turns ratio of about 1:2 followed by a turns ratio of about 1:500, which would provide a lowest high frequency bandwidth performance solution for the 1:1000 turns ratio. Alternatively, in at least some embodiments, the current transformer configuration can comprise a turns ratio of about 1:4 followed by a turns ratio of about 1:250. Alternatively, in at least some embodiments, the current transformer configuration can comprise a turns ratio of about 1:5 followed by a turns ratio of about 1:200. Alternatively, in at least some embodiments, the current transformer configuration can comprise a turns ratio of about 1:10 followed by a turns ratio of about 1:100. Alternatively, in at least some embodiments, the current transformer configuration can comprise a turns ratio of about 1:20 followed by a turns ratio of about 1:50. Alternatively, in at least some embodiments, the current transformer configuration can comprise a turns ratio of about 1:25 followed by a turns ratio of about 1:40, which would provide a greatest high frequency bandwidth performance (and having a turns ratio of exactly 1:1000). Alternatively, in at least some embodiments, the current transformer configuration can comprise a turns ratio of about 1:31 followed by a turns ratio of about 1:32, which would provide even slightly better high frequency bandwidth, but no longer exactly 1:1000 turns ratio (e.g., actually a turns ratio of 1:992). The inventor notes that an order in which the current transformers are connected is not significant, e.g., a turns ratio of 1:20 followed by a turns ratio of 1:50 is the same as a turns ratio of 1:50 followed by a turns ratio of 1:20.

Figure 5:
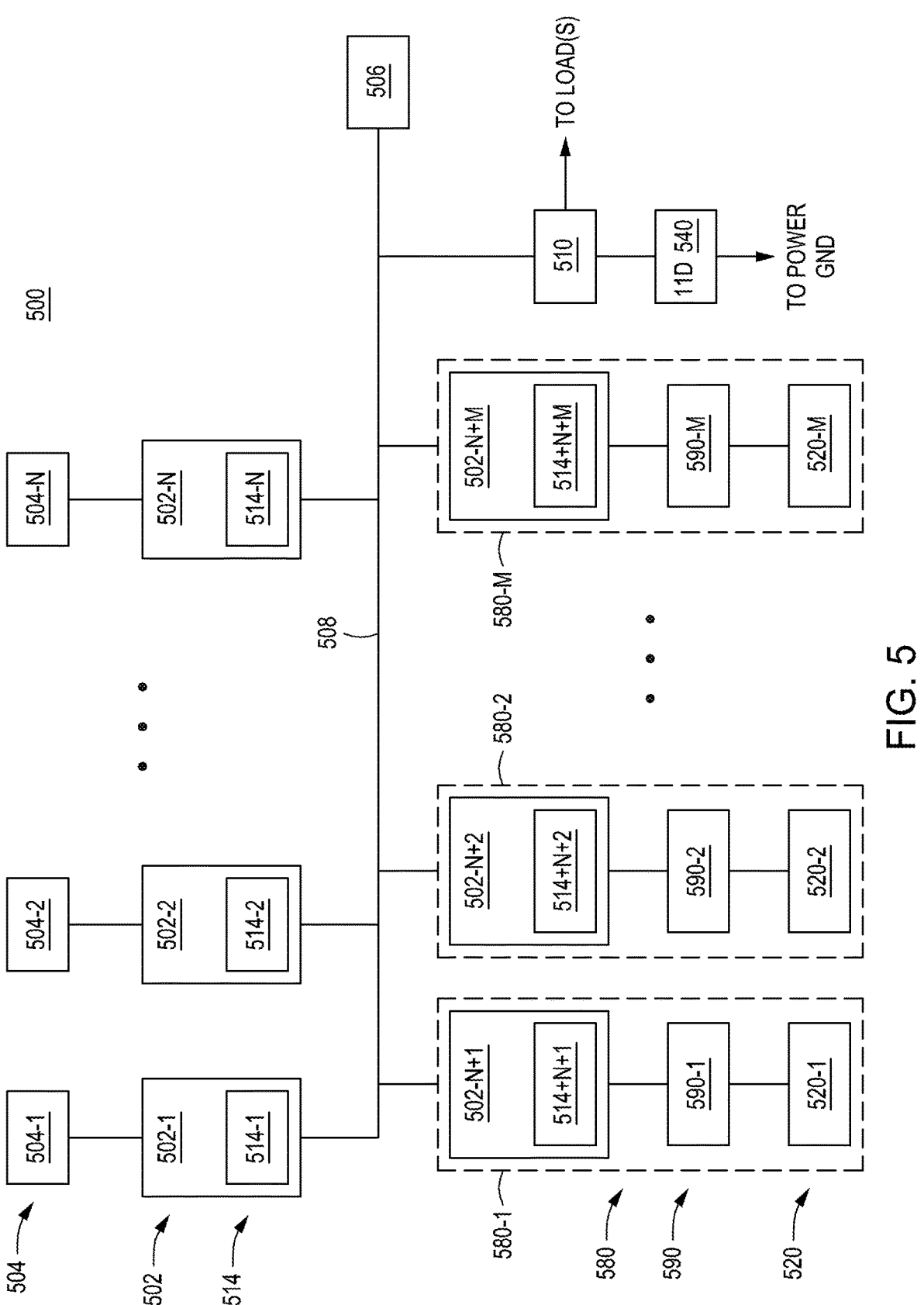
FIG. 5 is a block diagram of a system for power conversion, in accordance with at least some embodiments of the present disclosure.

FIG. 5 is a block diagram of a system for power conversion, in accordance with at least some embodiments of the present disclosure. The system 500 is a microgrid that can operate in both an islanded state and in a grid-connected state (i.e., when connected to another power grid (such as one or more other microgrids and/or a commercial power grid). The system 500 comprises a plurality of power converters 502-1, 502-2, . . . 502-N, 502-N+1, and 502-N+M collectively referred to as power converters 502 (which also may be called power conditioners); a plurality of DC power sources 504-1, 504-2, . . . 504-N, collectively referred to as power sources 504 (e.g., resources); a plurality of energy storage devices/delivery devices 520-1, 520-2, . . . 520-M collectively referred to as energy storage/delivery devices 520; a system controller 506; a plurality of BMUs 590-1,

590-2, . . . 590-M (battery management units) collectively referred to as BMUs 590; a system controller 506; a bus 508 (An AC bus); a load center 510; and an IID 540 (island interconnect device) (which may also be referred to as a microgrid interconnect device (MID)). In some embodiments, such as the embodiments described herein, the energy storage/delivery devices are rechargeable batteries (e.g., multi-C-rate collection of AC batteries) which may be referred to as batteries 520, although in other embodiments the energy storage/delivery devices may be any other suitable device for storing energy and providing the stored energy. Generally, each of the batteries 520 comprises a plurality of cells that are coupled in series, e.g., eight cells coupled in series to form a battery.

Each power converter 502-1, 502-2 . . . 102-N is coupled to a DC power source 504-1, 504-2 . . . 504-N, respectively, in a one-to-one correspondence, although in some other embodiments multiple DC power sources may be coupled to one or more of the power converters 502 (e.g., the power converter 102 or the power converter 202). The power converters 502-N+1, 502-N+2 . . . 502-N+M are respectively coupled to plurality of energy storage devices/delivery devices 520-1, 520-2 . . . 520-M via BMUs 590-1, 590-2 . . . 590-M to form AC batteries 580-1, 580-2 . . . 580-M, respectively. Each of the power converters 502-1, 502-2 . . . 502-N+M comprises a corresponding controller 514-1, 514-2 . . . 514-N+M (collectively referred to as the inverter controllers 514, e.g., the controller 106) for controlling operation of the power converters 502-1, 502-2 . . . 502-N+M.

In some embodiments, such as the embodiment described below, the DC power sources 504 are DC power sources and the power converters 502 are bidirectional inverters such that the power converters 502-1 . . . 502-N convert DC power from the DC power sources 504 to grid-compliant AC power that is coupled to the bus 508, and the power converters 502-N+1 . . . 502-N+M convert (during energy storage device discharge) DC power from the batteries 520 to grid-compliant AC power that is coupled to the bus 508 and also convert (during energy storage device charging) AC power from the bus 508 to DC output that is stored in the batteries 520 for subsequent use. The DC power sources 504 may be any suitable DC source, such as an output from a previous power conversion stage, a battery, a renewable energy source (e.g., a solar panel or photovoltaic (PV) module, a wind turbine, a hydroelectric system, or similar renewable energy source), or the like, for providing DC power. In other embodiments the power converter 502 may be other types of converters (such as DC-DC converters), and the bus 508 is a DC power bus.

The power converters 502 are coupled to the system controller 506 via the bus 508 (which also may be referred to as an AC line or a grid). The system controller 506 generally comprises a CPU coupled to each of support circuits and a memory that comprises a system control module for controlling some operational aspects of the system 500 and/or monitoring the system 500 (e.g., issuing certain command and control instructions to one or more of the power converters 502, collecting data related to the performance of the power converters 502, and the like). The system controller 506 is capable of communicating with the power converters 502 by wireless and/or wired communication (e.g., power line communication) for providing certain operative control and/or monitoring of the power converters 502.

In some embodiments, the system controller 506 may be a gateway that receives data (e.g., performance data) from the power converters 502 and communicates (e.g., via the Internet) the data and/or other information to a remote device or system, such as a master controller (not shown). Additionally or alternatively, the gateway may receive information from a remote device or system (not shown) and may communicate the information to the power converters 502 and/or use the information to generate control commands that are issued to the power converters 502.

The power converters 502 are coupled to the load center 510 via the bus 508, and the load center 510 is coupled to the power grid via the IID 540. When coupled to the power grid (e.g., a commercial grid or a larger microgrid) via the IID 540, the system 500 may be referred to as grid-connected; when disconnected from the power grid via the IID 540, the system 500 may be referred to as islanded. The IID 140 determines when to disconnect from/connect to the power grid (e.g., the IID 540 may detect a grid fluctuation, disturbance, outage or the like) and performs the disconnection/connection. Once disconnected from the power grid, the system 500 can continue to generate power as an intentional island, without imposing safety risks on any line workers that may be working on the grid, using the droop control techniques described herein. The IID 540 comprises a disconnect component (e.g., a disconnect relay) for physically disconnecting/connecting the system 500 from/to the power grid. In some embodiments, the IID 540 may additionally comprise an autoformer for coupling the system 500 to a split-phase load that may have a misbalance in it with some neutral current. In certain embodiments, the system controller 506 comprises the IID 540 or a portion of the IID 540.

The power converters 502 convert the DC power from the DC power sources 504 and discharging batteries 520 to grid-compliant AC power and couple the generated output power to the load center 510 via the bus 508. The power is then distributed to one or more loads (for example to one or more appliances) and/or to the power grid (when connected to the power grid). Additionally or alternatively, the generated energy may be stored for later use, for example using batteries, heated water, hydro pumping, $H_2O$-to-hydrogen conversion, or the like. Generally, the system 500 is coupled to the commercial power grid, although in some embodiments the power conversion system 100 is completely separate from the commercial grid and operates as an independent microgrid.

In some embodiments, the AC power generated by the power converter 102 is single-phase AC power. In other embodiments, the power converter 102 generates three-phase AC power.

While the foregoing is directed to embodiments of the present disclosure, other and further embodiments of the disclosure may be devised without departing from the basic scope thereof, and the scope thereof is determined by the claims that follow.

The invention claimed is:

1. An apparatus configured for use with a microinverter of an energy management system, comprising:
a cascaded current transformer configuration comprising
a first current transformer having a first primary winding coupled to a secondary winding of a power transformer that couples to a cycloconverter of the microinverter and having a first secondary winding coupled to a second primary winding of a second current transformer having a second secondary winding coupled to a measurement device configured to measure a current of the microinverter.

2. The apparatus of claim 1, wherein the cascaded current transformer configuration has a total effective turns ratio of 1:4096.

3. The apparatus of claim 2, wherein the first current transformer and the second current transformer each has a turns ratio of 1:64.

4. The apparatus of claim 2, further comprising a third current transformer, wherein a third first primary winding is connected to the second secondary winding of the second current transformer and a third secondary winding is connected to the measurement device, and wherein the first current transformer, the second current transformer, and the third current transformer each has a turns ratio of 1:16.

5. The apparatus of claim 1, wherein the microinverter comprises at least two switches connected to the secondary winding of the power transformer, and wherein the at least two switches are Gallium Nitride (GaN) power semiconductor switches.

6. The apparatus of claim 1, wherein the measurement device is an ADC chip.

7. An energy management system, comprising:
a DC power source connected to a power converter to convert DC power from the DC power source to grid-compliant AC power that is coupled to an AC bus; and
a cascaded current transformer configuration comprising
a first current transformer having a first primary winding coupled to a secondary winding of a power transformer that couples to a cycloconverter of the power converter and having a first secondary winding coupled to a second primary winding of a second current transformer having a second secondary winding coupled to a measurement device configured to measure a current of the power converter.

8. The energy management system of claim 7, wherein the cascaded current transformer configuration has a total effective turns ratio of 1:4096.

9. The energy management system of claim 8, wherein the first current transformer and the second current transformer each has a turns ratio of 1:64.

10. The energy management system of claim 8, further comprising a third current transformer, wherein a third first primary winding is connected to the second secondary winding of the second current transformer and a third secondary winding is connected to the measurement device, and wherein the first current transformer, the second current transformer, and the third current transformer each has a turns ratio of 1:16.

11. The energy management system of claim 7, wherein the power converter comprises at least two switches connected to the secondary winding of the power transformer, and wherein the at least two switches are Gallium Nitride (GaN) power semiconductor switches.

12. The energy management system of claim 7, wherein the measurement device is an ADC chip.

13. An apparatus configured for use with a microinverter of an energy management system, comprising:
a cascaded current transformer configuration comprising
a first current transformer having a first primary winding configured to couple to a secondary winding of a power transformer of the microinverter and having a first secondary winding coupled to a second primary winding of a second current transformer having a second secondary winding coupled to a measurement device configured to measure a current of the microinverter, wherein the microinverter comprises at least two switches connected to the secondary winding of the power transformer, and wherein the at least two switches are Gallium Nitride (GaN) power semiconductor switches, and wherein the measurement device is an ADC chip.

\* \* \* \* \*